US006295572B1

United States Patent
Wu

(10) Patent No.: US 6,295,572 B1
(45) Date of Patent: Sep. 25, 2001

(54) INTEGRATED SCSI AND ETHERNET CONTROLLER ON A PCI LOCAL BUS

(75) Inventor: Chih-Siung Wu, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 08/186,050

(22) Filed: Jan. 24, 1994

(51) Int. Cl.[7] ....................................... G06F 13/00
(52) U.S. Cl. ..................... 710/131; 710/100; 710/106; 710/126
(58) Field of Search ................. 395/275, 825.7; 371/407; 327/543, 565; 307/443

(56) References Cited

U.S. PATENT DOCUMENTS

| 4,100,601 | 7/1978 | Kaufman et al. ............ 364/200 |
| 4,313,160 | 1/1982 | Kaufman et al. ............ 364/260 |
| 4,902,986 | * 2/1990 | Lesmeister ................... 331/28 |
| 5,049,763 | * 9/1991 | Rogers ........................ 307/443 |
| 5,067,071 | * 11/1991 | Schanin ...................... 395/275 |
| 5,146,461 | * 9/1992 | Duschatko .................. 371/40.1 |
| 5,218,239 | * 6/1993 | Boomer ...................... 307/443 |
| 5,323,043 | 6/1994 | Kimura et al. .............. 257/371 |
| 5,336,915 | * 8/1994 | Fujita et al. ................ 257/369 |
| 5,345,357 | * 9/1994 | Pianka ........................ 361/56 |
| 5,371,419 | * 12/1994 | Sundby ....................... 327/543 |
| 5,381,554 | * 1/1995 | Langer et al. ............... 395/750 |
| 5,453,713 | * 9/1995 | Partovi et al. .............. 327/565 |

FOREIGN PATENT DOCUMENTS

| 0 535 873 A1 | 4/1993 | (EP) .................... H03K/19/01 |
| 2267 984 | 12/1993 | (GB) . |
| 62-018748 | 1/1987 | (JP) .................... H01L/27/04 |
| 4162658 | 6/1992 | (JP) .................... H01L/23/58 |

OTHER PUBLICATIONS

IC Puts Ethernet and SCSI on a Motherboard, by John Novellino (article from Electronic Design, Jan. 24, 1994), pp. 59–60, 62 and 66.
Der Neue Champion, PCI ist da: die ersten Boards und Karten im Test, by Georg Schnurer (article in Bussysteme Report, c't 1993, Hett 10), pp. 120–122.
AMD Proposal for AMD/(Undisclosed Party) Joint Ether-SCSI Development.
Golden Gate Design Specification.

* cited by examiner

Primary Examiner—Christopher B. Shin
(74) Attorney, Agent, or Firm—Fliesler, Dubb, Meyer & Lovejoy

(57) ABSTRACT

An integration of components of SCSI and Ethernet adapter boards onto a single chip forming an integrated Ethernet-SCSI controller for use on a PCI Local Bus. Integration is enabled by a reduction of noise. Noise is first reduced by reducing ground bounce by providing additional $V_{SS}$ pins for supporting large PCI and SCSI output buffers which constantly switch current. The VSS pins supporting the large PCI and SCSI output buffers support a limited number of output buffers located in a local area of the pin as connected to the pin by individual lines. Noise is additionally reduced by providing circuitry on the digital output buffers to limit the change of current over time (di/dt) during switching of the output buffers. Noise is further reduced by locating digital control circuitry so that current density increases in a direction away from analog circuitry. Finally, noise is reduced by including bidirectional silicon controlled rectifiers between power supplies in the analog portion, digital portion, and digital I/O buffer portion of the combined Ethernet-SCSI controller.

9 Claims, 7 Drawing Sheets

INTEGRATED SCSI AND ETHERNET CONTROLLER ON A PCI LOCAL BUS

BACKGROUND OF THE INVENTION

1. Field of the Invention

The present invention relates to the SCSI (Small Computer Systems Interface) and Ethernet adapter boards used in personal computers which interface with the PCI (Peripheral Component Interconnect) Local Bus. More particularly, the present invention relates to replacement of the SCSI and Ethernet adapter boards with a single chip.

2. Description of the Prior Art

The PCI Local Bus is a high performance, 32-bit or 64-bit bus with multiplexed address and data lines. As illustrated in FIG. 1, the PCI Local Bus 100 is intended for use as an interconnect mechanism between peripheral controller components, such as the SCSI adapter board 102, Ethernet adapter board 104, and processor/memory system 106. A PCI Local Bus Specification, Rev. 2.0, effective Apr. 30, 1993 includes protocol, electrical, mechanical and configuration requirements for the PCI Local Bus components and expansion boards. Further information concerning the PCI Local Bus specification can be obtained from the PCI Special Interest Group, M/S HF3-15A, 5200 NE Elam Young Parkway, Hillsboro, Oreg. 97124-6497.

Ethernet is a standard in personal computer networking. An Ethernet adapter board provides components for transmitting and receiving signals on a network allowing a personal computer in which it resides to be networked with other personal computers. A PCI bus interface unit on the Ethernet adapter board interfaces the adapter board with the PCI Local Bus on which a CPU resides. The PCI bus interface unit may provide digital signals to control the PCI Local Bus.

SCSI is a standard that allows users to easily add up to seven peripheral devices on a personal computer such as CD-ROM and high capacity disk drives. A SCSI adapter board in a personal computer provides digital address, data, and control signals to a SCSI bus on which peripheral devices reside. A PCI bus interface unit on the SCSI adapter board interfaces the adapter board with the PCI Local Bus on which a CPU resides. The PCI bus interface unit may provide digital signals to control the PCI bus.

Previously, manufacturers have provided Ethernet and SCSI components spaced apart on separate adapter boards. The high current requirements for digital signals transmitted and received on the PCI and SCSI buses means that the digital signals can generate significant noise. With sensitive analog components in the Ethernet controller, such as the phase lock loop (PLL) circuitry, such noise has prohibited integration of components of the Ethernet and SCSI adapter boards.

SUMMARY OF THE INVENTION

The present invention enables integration of the SCSI and Ethernet adapter board components by reducing noise generated by the digital signals resulting in very stable analog circuitry.

The present invention is an integration of components of SCSI and Ethernet adapter boards onto a single chip forming an integrated SCSI-Ethernet controller for use on a PCI Local Bus.

The present invention first reduces noise by reducing ground bounce on $V_{SS}$ pins connected to digital output buffers of the integrated SCSI-Ethernet controller. Ground bounce on $V_{SS}$ pins is first reduced by providing substantially more $V_{SS}$ pins than VDD pins to support large output buffers which continually switch current, each $V_{SS}$ pin supporting a limited number of buffers in a local area near the pin. The reduced current which each $V_{SS}$ pin has to sink, as well as limited line lengths to the $V_{SS}$ pin reduces inductance resulting in reduced ground bounce. To further reduce ground bounce, separate lines are provided from each output buffer to a $V_{SS}$ pin. By using separate lines, ground bounce resulting when multiple buffers switch together is reduced.

The present invention further reduces noise by utilizing circuitry for digital output buffers which limits the change in current over time (di/dt) during a signal transition. By limiting di/dt, noise created in the analog circuitry due to inductance is likewise limited.

The present invention additionally reduces noise by topologically organizing the digital control circuitry so that current density increases in a direction away from the analog circuitry.

Finally, the present invention reduces noise by preventing unnecessary current flow between separate analog and digital power supplies which may transfer noise between digital and analog components. Such current flow between the analog and digital power supplies is prevented by utilizing silicon control rectifiers (SCRs). SCRs are placed between power supplies. The SCRs enable current flow between the digital and analog supplies to prevent latch up should only one supply be turned on.

BRIEF DESCRIPTION OF THE DRAWINGS

Further details of the present invention are explained with the help of the attached drawings in which.

DETAILED DESCRIPTION

Figure 1:
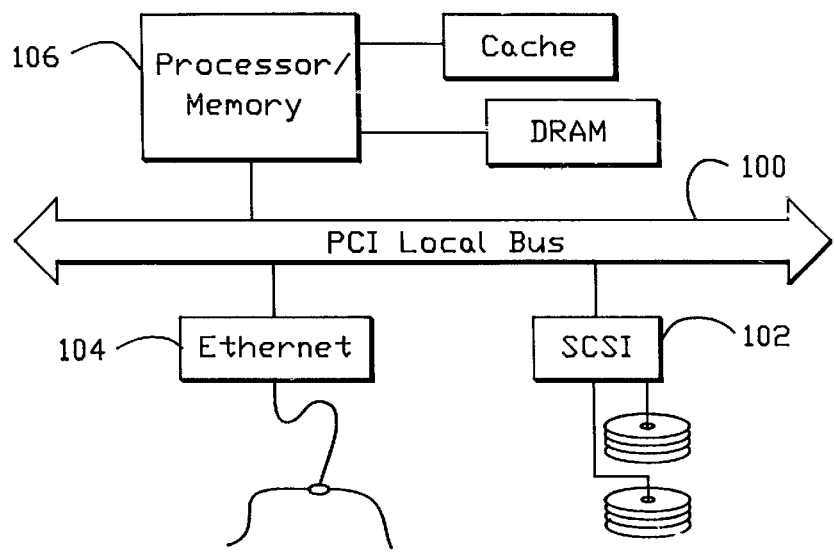
FIG. 1 illustrates an Ethernet adapter board, a SCSI adapter board, and a processor/memory system as connected to a PCI Local Bus.
Figure 2:
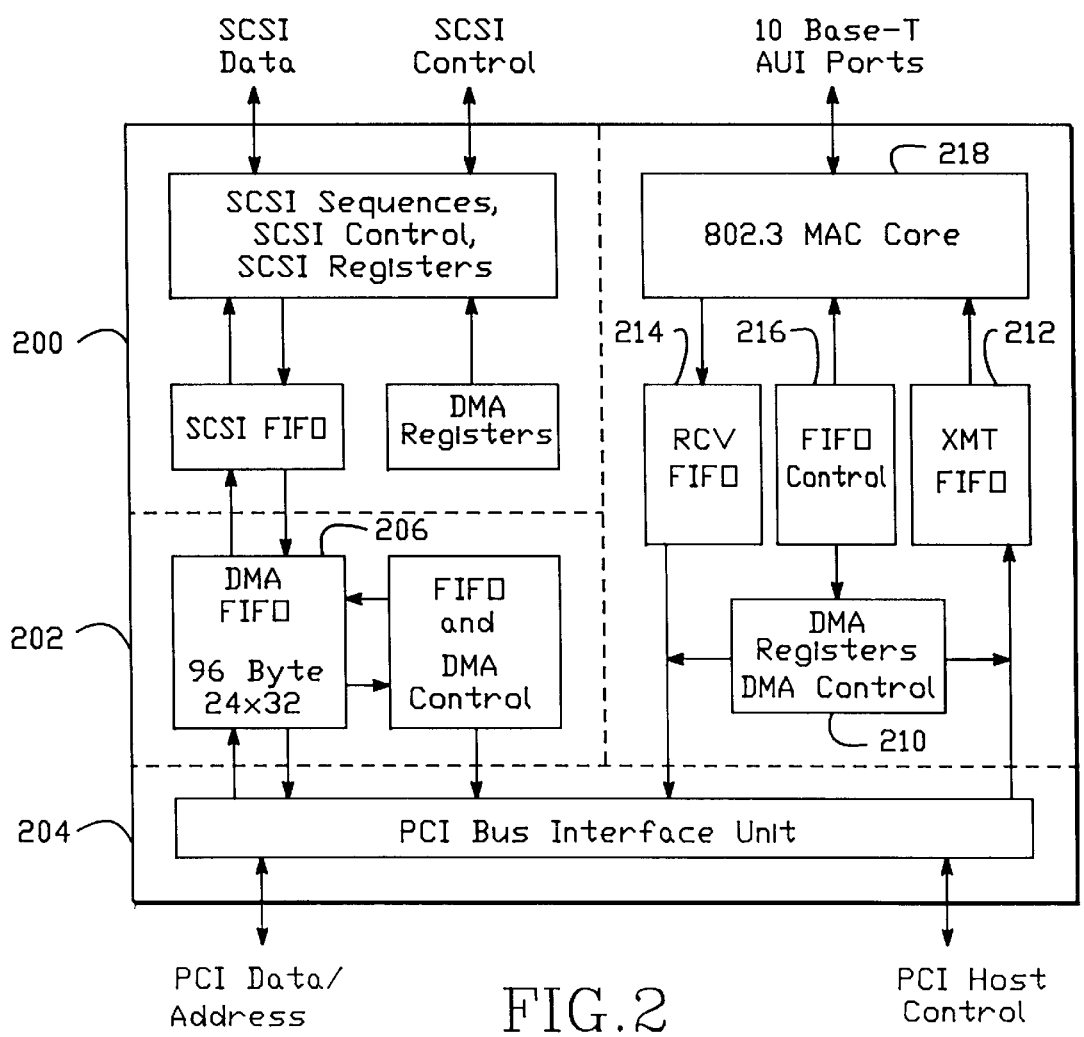
FIG. 2 shows a block diagram of components of a combined Ethernet-SCSI controller of the present invention.

FIG. 2 shows a block diagram of components of a combined Ethernet-SCSI controller of the present invention as coupled to a PCI Local Bus. A SCSI portion of the combined Ethernet-SCSI controller contains a Fast SCSI-2 core 200, a bus master DMA engine 202, and a PCI bus interface unit 204, collectively referred to herein as a SCSI controller. The Fast SCSI-2 core 200 provides an 8-bit SCSI interface supporting single-ended SCSI with transfer rates of 10 MB/sec. The bus master DMA engine 202 contains a 96-byte FIFO for 32-bit transfers in burst mode across the PCI Local Bus at 133 MB/sec speeds. The PCI bus interface unit 204 includes configuration space and a PCI master/slave interface and is a combined PCI controller utilized both by the SCSI portion and the Ethernet portions of the combined Ethernet-SCSI controller of the present invention. One method of combining separate SCSI and Ethernet PCI bus interface units into a single PCI bus interface unit 204 is described in U.S. patent application Ser. No. 08/184,295 entitled "Apparatus and Method For Integrating Bus Master Ownership of Local Bus Load By Plural Data Transceivers" as filed on Jan. 20, 1994, incorporated herein by reference.

The 32-bit Ethernet portion utilizes the combined PCI bus interface unit 204 and further includes a DMA buffer management unit 210, an individual 136-byte transmit FIFO 212, a 128-byte receive FIFO 214, a FIFO controller 216, and an IEEE 802.3-defined MAC (Media Access Control) core 218 supporting an IEEE 802.3 defined AUI (Attachment Unit Interface) and a 10 Base-T MAU (Media Attachment Unit), all collectively referred to herein as an Ethernet controller.

The combined Ethernet-SCSI controller of the present invention is integrated onto a chip which can be made available in a 132-pin Plastic Quad Flat Pack (PQFP). The combined Ethernet-SCSI controller chip is intended for use on the motherboard of a personal computer. The Ethernet-SCSI controller chip is directly installed on the motherboard and coupled with the PCI Local Bus, the SCSI bus, and an Ethernet transceiver. The SCSI CLK input to the chip is provided by a SCSI crystal also installed on the motherboard.

Figure 3:
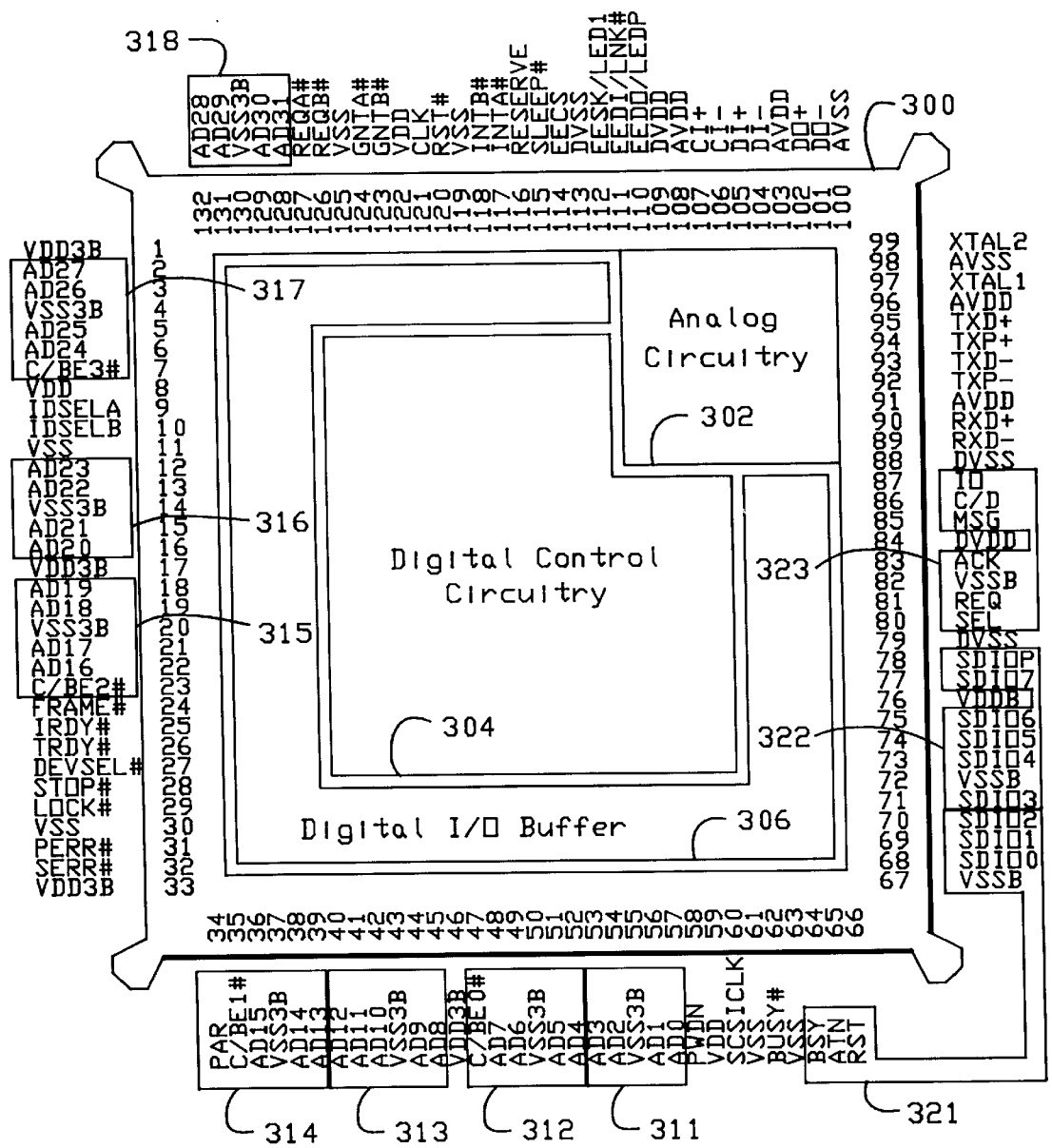
FIG. 3 shows a pin-out for a 132-pin package containing the combined Ethernet-SCSI controller of the present invention.

FIG. 3 shows a pin-out 300 for a 132-pin PQFP capable of containing the combined Ethernet-SCSI controller of the present invention. As illustrated, the pin connections are arranged so that layout of circuitry on the chip includes an analog portion 302 provided separately from digital control circuitry 304 and digital I/O buffer circuitry 306. Table A lists the pin names along with a brief description of the pin functions. The pin names are further are organized to indicate whether the pins are utilized for the PCI Bus Interface, the Ethernet interface, the SCSI interface, Power Supplies, or Miscellaneous functions in Table A which follows. A more detailed description of the pins listed in Table are included in Appendix A.

TABLE A

| PIN NAME | DESCRIPTION |
| --- | --- |
| PCI INTERFACE | |
| AD[31:00] | Address/Data Bus |
| C/BE[3.0] | Bus Command/Byte Enable |
| CLK | Bus Clock |
| DEVSEL | Device Select |
| FRAME | Cycle Frame |
| GNTA,GNTB | Bus Grant |

TABLE A-continued

| PIN NAME | DESCRIPTION |
| --- | --- |
| IDSELA, IDSELB | Initialization Device Select |
| INTA, INTB | Interrupt |
| IRDY | Initiator Ready |
| LOCK | Bus Lock |
| PAR | Parity |
| PERR | Parity Error |
| REQA, REQB | Bus Request |
| RST | Reset |
| SERR | System Error |
| STOP | Stop |
| TRDY | Target Ready |
| ETHERNET INTERFACE | |
| EECS | Microwire Serial PROM Chip Select |
| EEDI/LNK | Microwire Serial EEPROM Data In/Link Status |
| EEDO/LEDP | Microwire APROM Data Out/LED predriver |
| EESK/LED1 | Microwire Serial PROM Clock/LED1 |
| SLEEP | Sleep Mode |
| XTAL1, XTAL2 | Crystal Input/Output |
| ATTACHMENT UNIT INTERFACE (AUI) | |
| CI+/CI− | AUI Collision Differential Pair |
| DI+/DI− | AUI Data In Differential Pair |
| DO+/DO− | AUI Data Out Differential Pair |
| 10BASE-T INTERFACE | |
| RXD+/RXD− | Receive Differential Pair |
| TXD+/TXD− | Transmit Differential Pair |
| TXP+/TXP− | Transmit Pre-distortion Differential Pair |
| SCSI INTERFACE | |
| SDIO[7:0] | SCSI Data |
| SDIOP | SCSI Data Parity |
| MSG | Message |
| C/D | Command/Data |
| I/O | Input/Output |
| ATN | Attention |
| BSY | Busy |
| SEL | Select |
| RST | SCSI Bus Reset |
| REQ | Request |
| ACK | Acknowledge |
| MISCELLANEOUS | |
| SCSI CLK | SCSI Core Clock |
| RESERVE | Reserved, DO NOT CONNECT |
| BUSY | NAND Tree Test Output |
| PWDN | Power Down |
| POWER SUPPLIES | |
| $AV_{DD}$ | Analog Power |
| $AV_{SS}$ | Analog Ground |
| $DV_{DD}$ | Ethernet Digital Power |
| $DV_{SS}$ | Ethernet Digital Ground |
| $V_{DD}$ | General Digital Power |
| $V_{SS}$ | General Digital Ground |
| $V_{DDB}$ | Power for SCSI I/O Buffers |
| $V_{SSB}$ | Ground for SCSI I/O Buffers |
| $V_{DD3B}$ | Power for PCI AD [31:0] CIBE[3:0], and PAR pin I/O Buffers |
| $V_{SS3B}$ | PCI I/O Buffer Ground for PCI AD [31:0] C/BE[3:0], and PAR pin I/O Buffers |

Even with the analog circuitry 302 of FIG. 3 separated from digital circuitry 304 and 306, current in the digital circuitry will generate significant noise in sensitive components of the analog circuitry 302, such as the phase lock loop (PLL) creating problems. Additional measures are therefore implemented to reduce noise in the analog circuitry 302 as described in the sections below.

A. Localized VSS For Digital Output Buffers

Noise in the analog circuitry 302 of FIG. 3 can be generated from current switching in the PCI and SCSI output buffers included in the digital I/O buffer circuitry 306. The PCI interface includes large output buffers connected to the AD[31:0], C/BE[3:0], and PAR pins, each pin connected to an output buffer switching current nearly every clock cycle, the pins carrying the maximum current required by the PCI Local Bus specification, Rev. 2.0. The SCSI interface also includes large output buffers connected to all pins listed in Table A under the SCSI Interface, each large output buffer switching current nearly every clock cycle and receiving up to a 48 milliamp signal.

With several of the large PCI or SCSI output buffers switching simultaneously, significant ground bounce can result which introduces noise current to the analog circuitry 302. The ground bounce results in part because of the limited ability of the source pins which would normally be utilized in an integrated circuit to effectively sink the current received.

To reduce ground bounce, the present invention first utilizes a number of VSSB and VSS3B pins supporting the large PCI and SCSI output buffers substantially greater than corresponding drain voltage pins VDDB and VDD3B. The VSS3B and VDD3B pin connections support only the large PCI output buffers connected to the AD[32:0], C/BE[3:0] and PAR pins. The VSSB and VDDB pin connections support only the large SCSI output buffers connected to the pins listed under the SCSI interface portion of Table A.

Ground bounce is further reduced by limiting the number of large output buffers supported by the additional VSSB and VSS3B pins. Blocks 311–318 and 321–323 of FIG. 3 show the VSSB and VSS3B pins along with the output buffer pins which they support. As shown by blocks 311–318, each VSS3B pin supports a maximum of five output buffers. As shown by blocks 321–323, each VSSB pin supports a maximum of six output buffers.

To further reduce ground bounce, as additionally illustrated by the blocks 311–318 and 321–323 of FIG. 3, the large output buffers supported by an individual VSSB or VSS3B pin are located in the local area surrounding the individual pin. By locating the output buffers close to their ground pins, line lengths which create inductances are reduced likewise limiting ground bounce.

Figure 4:
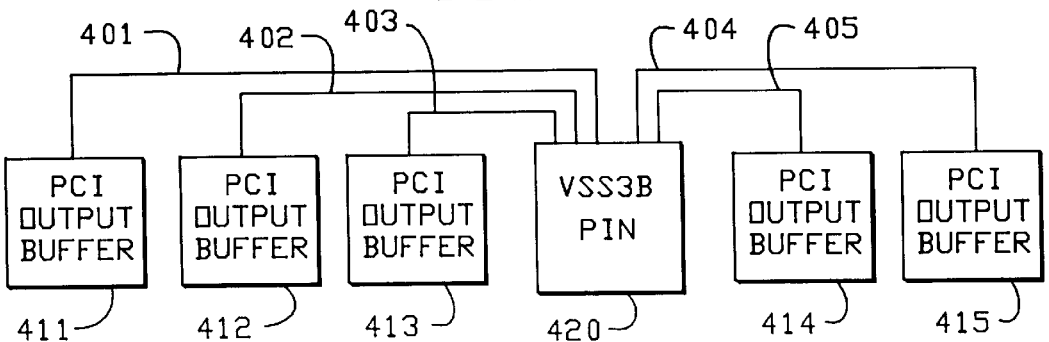
FIG. 4 illustrates how individual lines are utilized to carry power from output buffers to VSS3B pins.

FIG. 4 illustrates two additional ways in which ground bounce is reduced for the VSS3B pins connected to the large PCI output buffers. First, to further limit line length and reduce inductance, the VSS3B pin 420 is centrally located among the large output buffers 411–414 which it supports. By further reducing inductance in this manner, ground bounce will likewise be additionally reduced. Second, individual lines 401–405 are provided to carry power from individual output buffers 411–415 to the VSS3B pin 420. By using separate lines instead of a single power line, ground bounce resulting when multiple output buffers switch together will be reduced.

B. Limited di/dt in Digital Output Buffers

Figure 5:
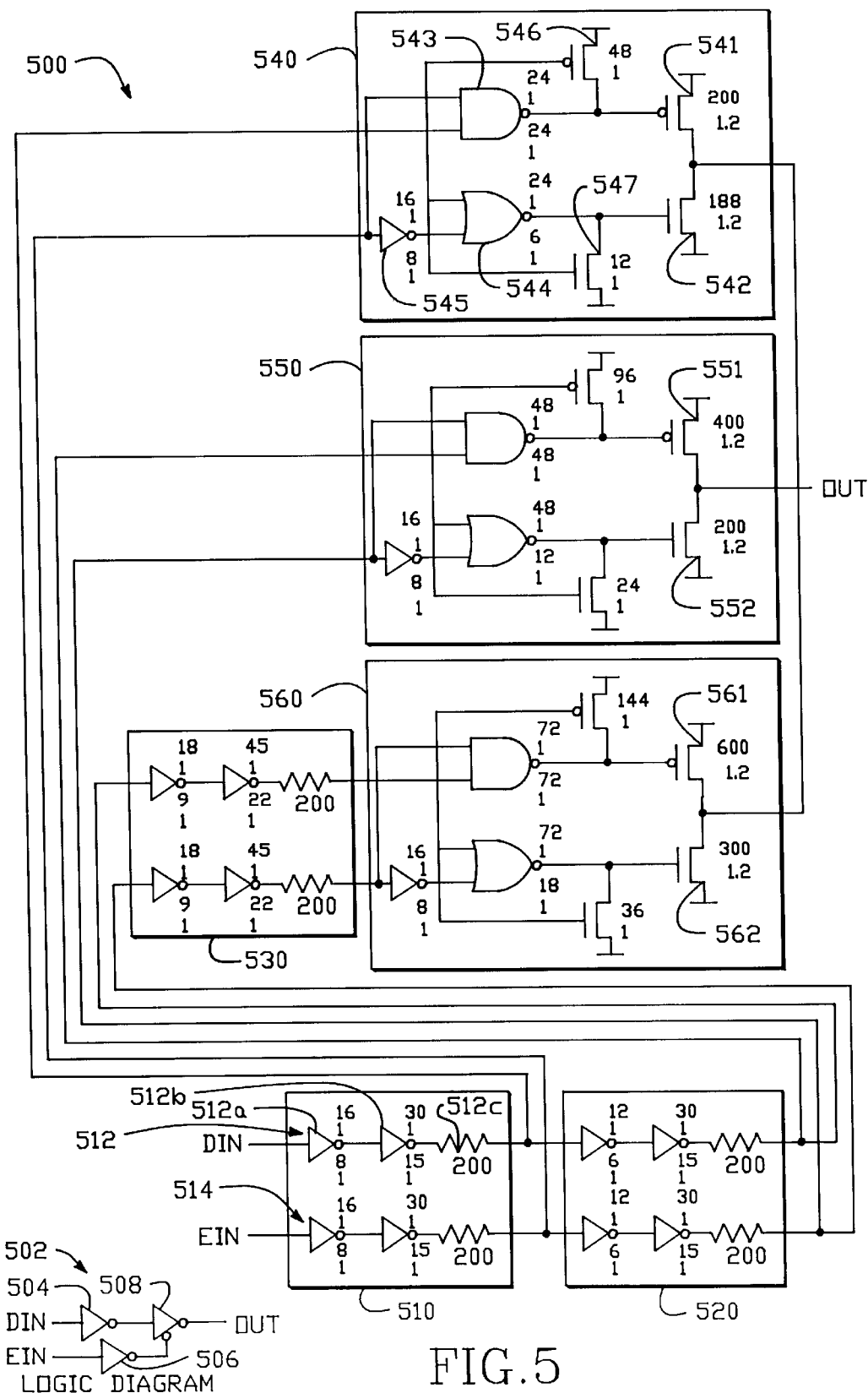
FIG. 5 shows circuitry for an output buffer utilized in the present invention along with a logic diagram for the output buffer.

The present invention further provides circuitry for limiting the change in current (di/dt) sourced and sank by the PCI and SCSI output buffers to reduce noise affecting the analog circuitry 302 of FIG. 3. FIG. 5 shows circuitry for the output buffer 500 of the present invention along with a logic diagram 502 for the circuitry.

As shown in the logic diagram 502, the output buffer of the present invention receives a data signal (DIN) at the input of an inverter 504 and an enabling signal (EIN) at the input of an inverter 506. The output of inverter 504 forms the input of a tri-state buffer 508 which is enabled by a low signal from the output of inverter 506. The output of tri-state buffer 508 thus produces an output signal (OUT) corresponding to the DIN signal as enabled by the EIN signal.

To implement logic diagram 502 and provide circuitry for limiting di/dt, the circuitry 500 of the present invention includes three tri-state buffers 540, 550 and 560 which are driven by three delay sections 510, 520 and 530 respectively. Components of these sections and their operation are described below.

1. Delay Sections 510, 520 and 530

The DIN and EIN signals are received by first delay section 510. First delay section 510 delays the DIN signal utilizing delay elements 512, while the EIN signal is delayed utilizing elements 514. The delay elements 512 include two inverters 512a and 512b and a 200 ohm resistor 512c connected in series. The delay elements 514 are identical to elements 512.

Resistor 512c is utilized in series with the two inverters 512a and 512b to counteract processing variations to provide a smoother output di/dt. The processing variations cause variations in the thickness of the gate oxide layer for transistors in inverters 512a and 512b as well as transistors in the first tri-state buffer 540. A thinner oxide layer in the transistors of inverters 512a and 512b reduce capacitance, thus increasing speed, while a thicker oxide layer results in a reduced speed. Variations in delays of inverters 512a and 512b cause a potential increase in di/dt of the output buffer 500.

To counteract the process variations in the oxide layer, resister 512c is utilized in series with inverters 512a and 512b. In contrast to a thinner oxide layer decreasing capacitance and increasing speed of inverters 512a and 512b, a thinner oxide layer increases the parasitic capacitance at the input of first tri-state buffer 540. Resistor 512c acting in combination with the parasitic capacitance at the input of tri-state buffer 540 forms an RC time delay reducing speed, thus counteracting the speed increase of inverters 512a and 512b. With an increase in oxide thickness inverters 512a and 512b decrease speed, while the RC delay resulting from resistor 512c and the parasitic input capacitance of tri-state buffer 540 increases speed. Thus, by utilizing the resistor 512c in series with inverters 512a and 512b, an increased di/dt due to process variations is prevented.

The outputs of first delay section 510 are also fed to second delay section 520 which includes two sets of two inverters and a 200 ohm resistor in series, similar to the first delay section 510. Like the circuitry of first delay section 510, the second delay section 520 includes resistors in series with inverters to counteract processing variations in the gate oxide layer.

The outputs of second delay section 520 are also fed to third delay section 530, again including two sets of inverters and a 200 ohm resistor in series similar to the first and second delay sections 510 and 520 with resistors utilized to counteract process variations.

2. Tri-State Buffer Sections 540, 550 and 560

The outputs of first delay section 510 form the inputs to the first tri-state buffer 540. The first tri-state buffer 540 includes a p-channel pull up transistor 541 and an n-channel pull down transistor 542. The source of pull-up transistor 541 is connected to VDDB or VDD3B, while its drain is connected to the drain of transistor 542 forming the output (OUT) of the output buffer 500. The source of transistor 542 is connected to VSSB or VSS3B.

The gate of the pull up transistor 541 is connected to the output of a NAND gate 543 which has inputs connected to the outputs of first delay section 510. The gate of pull down transistor 542 is connected to the output of a NOR gate 544 which has inputs connected to the outputs of first delay section 510, the EIN output, however, being inverted by inverter 545.

Transistors 546 and 547 are provided to slow the current increase upon turn on or turn off of pull up and pull down transistors 541 and 547, thus reducing current spikes which increase di/dt on the output (OUT). Transistor 546 operates in conjunction with the pull up transistor of NAND gate 543, while transistor 547 operates in conjunction with the pull down transistor of NOR gate 547. The p-channel transistor 546 has a source connected to VDD3B or VDDB and a drain connected to the input of pull up transistor 541. The gate of transistor 546 is connected to the DIN output of first delay section 510. The n-channel transistor 547 has a source connected to VSS3B or VSSB and a drain connected to the input of pull down transistor 542. The gate of transistor 547 is connected to the DIN output of first delay section 510.

The outputs of second delay circuitry 520 are fed to the inputs of a second tri-state buffer 550. The second tri-state buffer 550 has circuit components similar to the first tri-state buffer 540 with inputs connected to the DIN and EIN outputs of second delay section 520 in the same manner that the first tri-state buffer 540 is connected to the first delay section 510, and an output connected to OUT in the same manner as the first tri-state buffer 540.

The outputs of third delay section 530 are fed to a third tri-state buffer 560. The third tri-state buffer 560 has circuit components similar to the first and second tri-state buffers 540 and 550 with inputs connected to the DIN and EIN outputs of third delay section 530 in the same manner as the first and second tri-state buffers 540 and 550 are connected to first and second delay sections 510 and 520, and an output connected to OUT in the same manner as the first and second tri-state buffers 540 and 550.

3. Operation With Output Buffer 500 Sourcing Current

In operation, we first look at the case where a HIGH OUT signal is provided. We, therefore, assume both the DIN and EIN signals are switched to HIGH. With DIN and EIN going HIGH, the outputs of first delay section 510 will go HIGH making the outputs of both the NAND gate 543 and NOR gate 544 LOW. Further with DIN going HIGH, transistor 546 will turn off, while transistor 547 turns on. With the output of NAND gate 543 LOW and transistor 546 off, pull up transistor 541 will turn on to pull up transistor 541 pulling the output (OUT) HIGH. With the output of NOR gate LOW and transistor 547 on, pull down transistor 542 will remain off.

After a short time delay through second delay section 520, the pull up transistor 551 of the second tri-state buffer 550 will turn on to additionally provide current to the output (OUT). Again, after another short delay through third delay section 530, the pull up transistor 561 of the third tri-state buffer 560 will turn on to provide additional current to the output (OUT).

Figure 6:
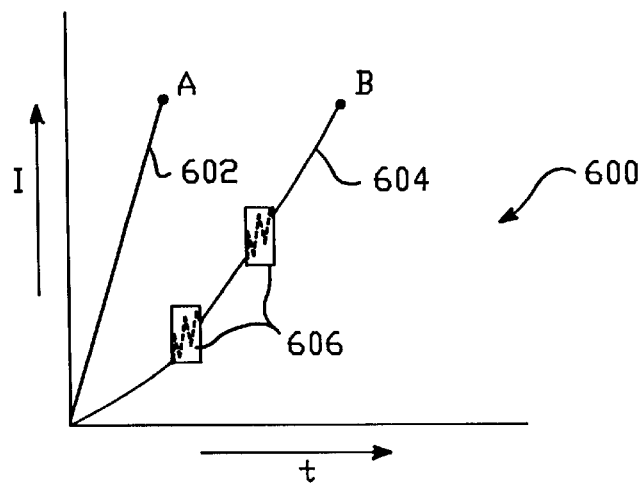
FIG. 6 illustrates how a decrease in di/dt is achieved by the use of output buffer circuitry of FIG. 5.

FIG. 6 illustrates how a decrease in di/dt is achieved by the use of three separate tri-state buffers 540, 550 and 560 with delay sections 510, 520 and 530 as shown in FIG. 5. Curve 602 represents the change in current (I) vs. time (t) of an output buffer utilizing a single tri-state buffer designed to reach a current level A. By utilizing three separate tri-state buffers 540, 550 and 560 with outputs delayed by delay sections 520 and 530 as shown in FIG. 5, a curve 604 can be maintained to reach the same current level over a greater time at point B, thus decreasing di/dt. Note that transistor sizes are indicated for the output buffer circuitry 500 of FIG. 5, the sizes showing that the pull up transistors of the tri-state buffers 541, 551 and 561 gradually increase in size also allowing a gradually increasing current, also decreasing di/dt.

Current spikes which increase di/dt, as shown by the dashed lines in boxes 606 of FIG. 6, can be caused during turn on of the second and third tri-state buffers 550 and 560. The circuitry 500 of the present invention prevents the current spikes by utilizing the transistors such as 546 and 547 in each tri-state buffer which, as discussed above, slow the current increase of each tri-state buffer upon turn on.

4. Operation With Output Buffer 500 Sinking Current

We next look at the case where a LOW OUT signal is provided. We begin by assuming that the DIN signal switches to LOW while the EIN signal remains high. With DIN low and EIN high, delay section 510 will provide similar signals switching the outputs of both NAND gate 543 and NOR gate 544 to HIGH. Further, transistor 546 will turn on, while transistor 547 turns off. With the output of NOR gate HIGH and transistor 547 off, pull down transistor 542 will turn on, sinking current on the output (OUT). With the output of NAND gate 543 HIGH and transistor 546 on, pull-up transistor 546 will turn off. By providing three separate tri-state buffer sections with pull down transistors 542, 552 and 562 of increasing sizes turning on after respective delays, current sunk is gradually increased to a required amount, thus reducing di/dt and reducing ground bounce.

Transistors, such as 546 and 547, in each of the three tri-state buffers 540, 550 and 560 also enable a reduction in di/dt when additional tri-state buffer states switch to LOW, just as when they switch to HIGH as discussed above. A transistor, such as 547, operates in conjunction with the pull down transistor of a NOR gate, such as 544, to enable a reduction of current over time (di/dt) when a pull down transistor, such as 542, is turning on, thus reducing ground bounce and limiting noise in the analog section 302 of FIG. 3.

Transistors, such as 546 and 547, in each of tri-state buffers 540, 550 and 560 also prevent a crowbar effect when the output (OUT) transitions from HIGH to LOW or from LOW to HIGH. Because a second and third delay elements 520 and 530 delay the turn off of pull-up transistors 551 and 561 of the second and third tri-state buffers 550 and 560, a crowbar effect could occur when pull down transistor 542 attempts to sink current should pull up transistors 551 and 561 remain on. Transistors, such as transistor 546 and 547, are therefore sized as shown in FIG. 5 to delay turn on of transistor 542 to prevent such crowbarring. Transistors, such as 546 and 547 prevent such crowbarring both when the tri-state buffers outputs switch from HIGH to LOW as well as when they switch from LOW to HIGH.

Thus, by utilizing the output buffer circuitry 500 in the combined Ethernet-SCSI controller of the present invention the rate of change of current (di/dt) is controlled to reduce noise in current sourced, as well as to limit ground bounce on current sank.

Further information for enhancing the output buffer circuitry 500, including providing an mechanism for autosensing whether a 3.3 of 5.0 volt output is required, and providing an output in compliance with such autosensing is disclosed in U.S. patent application Ser. No. 08/185,137, entitled "Apparatus and Method For Automatic Sense And Establishment Of 5V And 3.3V Operation", by Wu et al. filed Jan. 24, 1994, and incorporated herein by reference.

C. Topological Organization of Components

Figure 7:
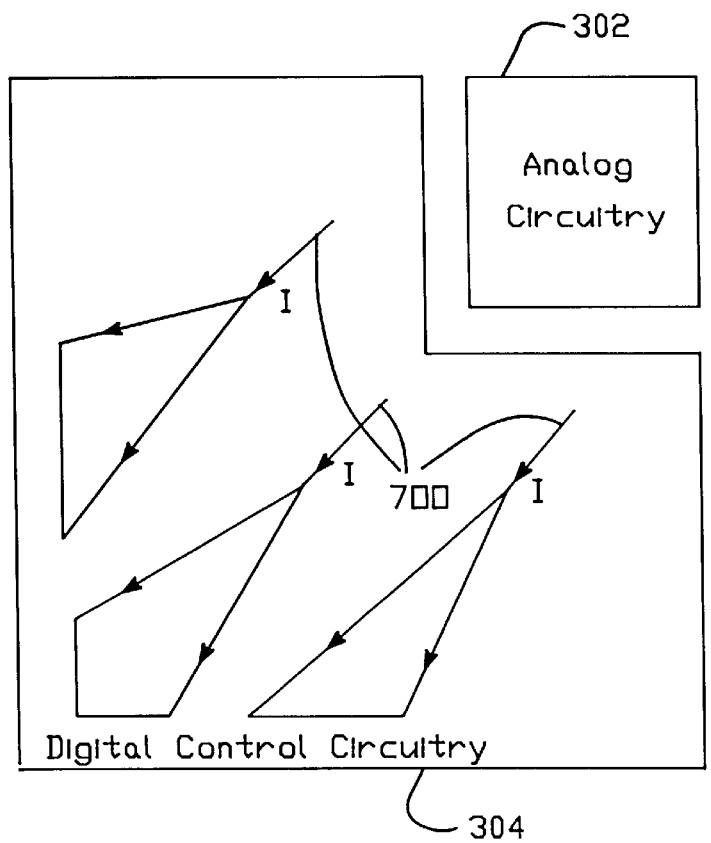
FIG. 7 illustrates how the digital control circuitry is organized so current density increases in a direction away from analog circuitry.

An additional source of noise created in the analog circuitry 302 of FIG. 3 is current flowing in the digital control circuitry 304. As illustrated in FIG. 7, to reduce such noise, the present invention topologically organizes components of the digital control circuitry 304 so that current density increases in a direction away from the analog circuitry 302 as illustrated by arrows 700. Additionally, the analog circuitry 304 is topologically organized to protect against noise from the digital circuitry. Organization of circuitry to reduce noise due to current flow in the digital circuitry is described in the sections below.

1. Overall Organization of Chip Circuitry

Figure 8:
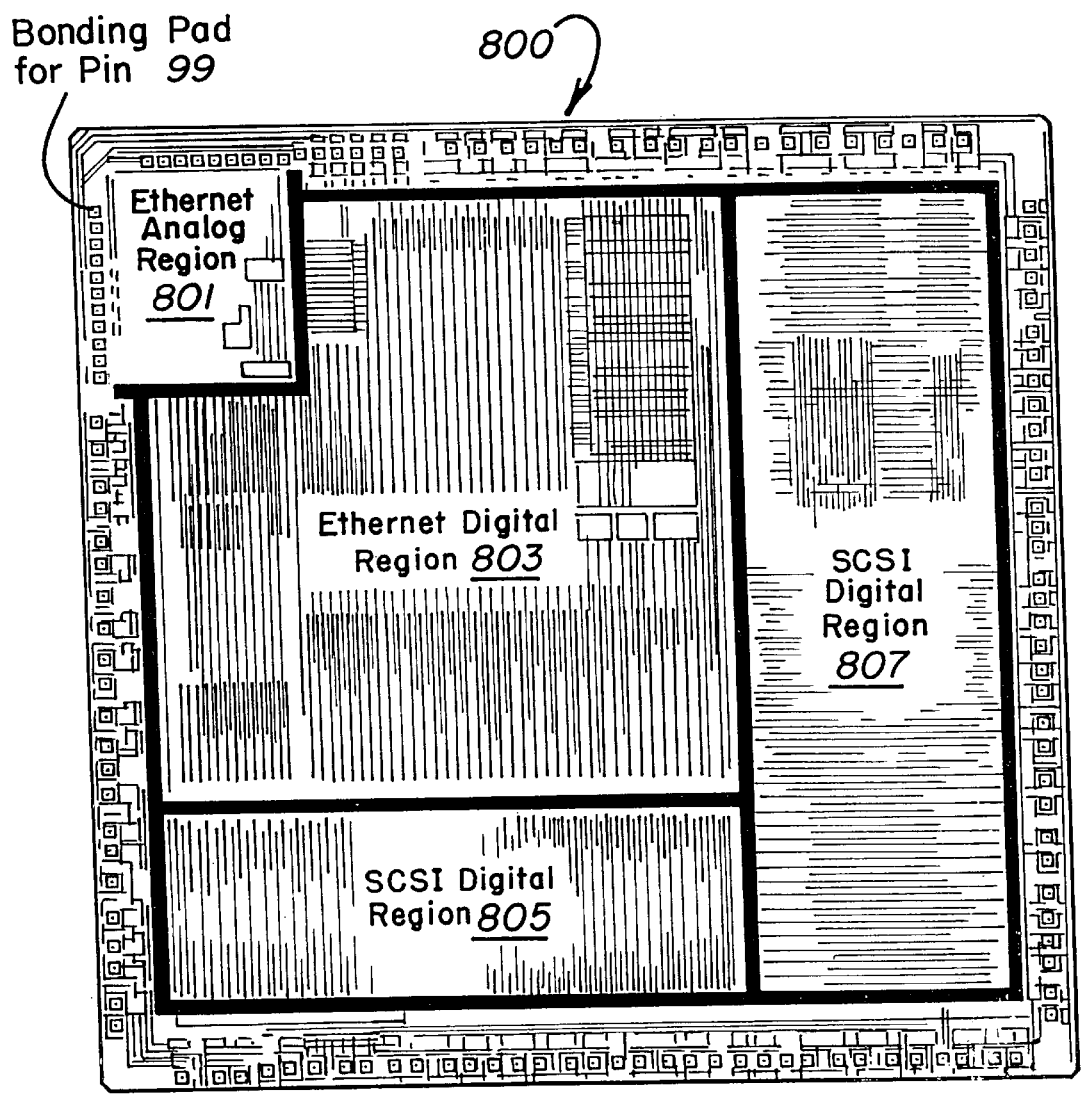
FIG. 8 shows a scale layout of an integrated circuit chip containing the combined Ethernet-SCSI controller of the present invention.

FIG. 8 shows a scale layout of the integrated circuit chip 800 containing the combined Ethernet-SCSI controller. Chip 800 is approximately 300 to 400 mils on each side and a 0.8 micron, double-metal process is used to define its circuitry. White bands are painted around regions 801, 803, 805 and 807 to better highlight them. The chip die lays circuit-side down when packaged in package 300. The pinout in FIG. 8 is therefore a mirror image of that shown in FIG. 3. The bonding pad for pin number 99, for example, near the top along the left edge of the layout shown in FIG. 8 while the corresponding bonding pad for pin number 99 (XTAL2) is positioned near the top along the right edge of the package pinout shown in FIG. 3.

The combination of the Ethernet analog region 801 and the Ethernet digital control region 803 generally defines a square shape in FIG. 8, with region 801 defining the top left quadrant of that square shape. Region 801 corresponds to the analog circuitry 302 of FIG. 3. The SCSI digital control region 805 is positioned as a rectangle having its longest side below and adjacent the bottom of the Ethernet digital control region 803. The PCI digital control region 807 is positioned as a rectangle having its long side extending to right and adjacent the right sides of both the Ethernet digital control region 803 and the SCSI digital control region 805. Digital I/O buffers 809, corresponding to the digital output buffers 306 of FIG. 3 are positioned about peripheral edges of digital control regions 805 to 807.

2. Routing Of VDD Lines

Figure 9:
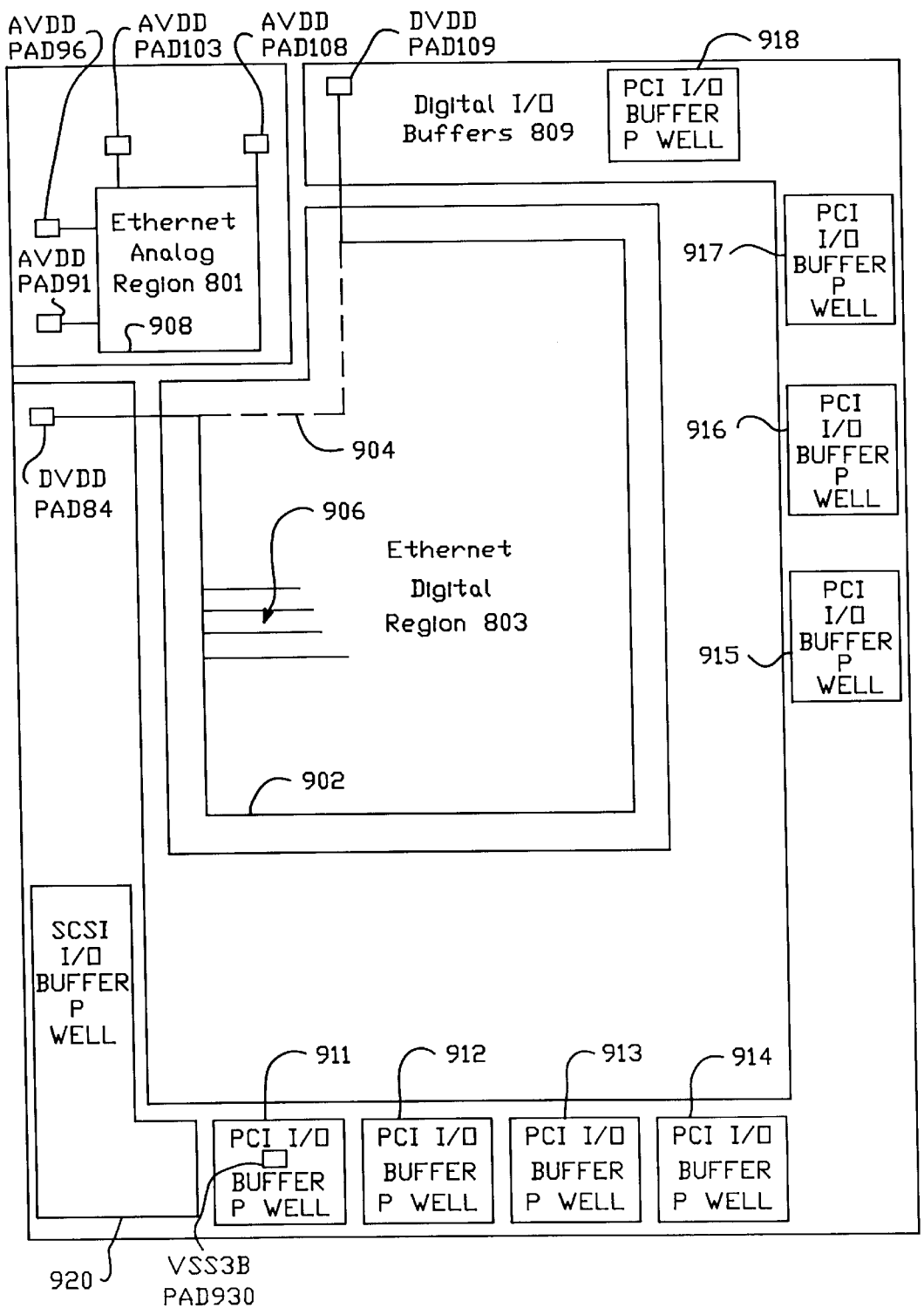
FIG. 9 shows the configuration of source power lines in the Ethernet analog and digital regions and illustrates the layout of portions of the digital I/O buffer circuitry.

FIG. 9 shows the configuration of source power lines in the Ethernet Analog Region 801 and Ethernet digital region 803 as configured to reduce noise in analog region 801. As shown, separate DVDD pin pads 84 and 104 carry power to the ethernet digital region 803. Power is provided from DVDD pads 84 and 109 on power distribution line 902 along the perimeter of Ethernet digital region 803 fartherest away from analog region 801. Power is distributed from the power distribution line 902 to circuitry 906 as illustrated, enabling the maximum current density to be greatest farther away from analog region 801. By distributing power along dashed line 904 instead of power distribution line 902, current density would be greatest closer to the analog region 801.

Noise is generated in circuit components of analog region 801 by resistive coupling of current in the ethernet digital circuitry through the substrate to sensitive analog components. By having a larger current density, particularly with current carried by power distribution line 902, located next to the analog circuitry, significant noise can be created in the analog components due to coupling through the substrate. Thus, by locating power distribution line 902 near the perimeter of the Ethernet digital circuitry 803 away from the analog circuitry 801, noise is reduced.

Noise coupling through the substrate between the Ethernet digital region 803 and components in the analog region 801 is also reduced by the routing of an analog power distribution line 908. Analog power distribution line 908 is connected to AVDD pin pads 91, 96, 103 and 108 as shown. Analog power distribution line 908 is routed around the perimeter of the analog circuit 801 to provide a barrier to current coupling through the substrate from Ethernet digital section 803 to sensitive analog components located within.

3. Organization Of VSS Portions

FIG. 9 also illustrates the configuration of the digital I/O buffer section 809 so that layout for output buffers and their supporting VSSB and VSS3B connections reduces noise in Ethernet analog section 801. As shown in FIG. 9, isolated p wells 911–918 are provided in the digital I/O buffer section 809. Each of p wells 911–918 support connections for a VSS3B pin and portions of their corresponding output buffers, each p well 911–918 supporting structures connected to pins in corresponding sections 311–318 of FIG. 3, respectively. Another isolated p well 920 is provided to support the VSSB pins and portions of their corresponding SCSI output buffers, the p well 920 supporting structures connected to pins in sections 321, 322 and 323 of FIG. 3.

By providing the separate p-wells 911–918 and 920 for VSSB and VSS3B pins and components of the output buffers which they support, noise can be isolated. To further isolate noise, each of p wells 911–918 carry a VSS3B pin connection located in its center as illustrated by pad 930. Additionally, the n-channel transistors of output buffer circuits supported by the VSS3B pin at the center of the p well are provided in the p well region.

To further reduce noise, the p well is made as small as possible and located as close as possible to its VSS3B pin to minimize lead length and associated ground bounce. Further, remaining portions of output buffers supported by the p-well are positioned as close as possible to p well and supporting I/O pad and $V_{SS3B}$ pin.

Note that the Ethernet interface pins of FIG. 8 are positioned about one corner of the square-shaped die and the PCI interface pins are positioned about a diagonally-opposed second corner and spaced apart from the Ethernet pins. This is done to limit noise form the usually-active PCI local bus from coupling to sensitive analog circuitry. Note in particular that the output buffers that are expected to generate the most switching noise, the large PCI output buffers connected to the AD[31:0], CB/E[3:0] and PAR pins, are arranged to be positioned as far away as possible from the analog circuitry 301.

The PCI output buffers create the most noise because they operate at the highest switching frequencies (e.g., 33 MHz) and each such PCI output buffer both sources relatively large amounts of current (e.g., 44 mA per pin) and sinks relatively large amounts of current. The SCSI output buffers do not source as much current as the PCI output buffers, and although the SCSI output buffers do sink relatively large amounts of current, they do not create as much noise as the PCI buffers because switching frequencies are lower. Hence p wells for the PCI output buffers 911–918 are provided separately, while a single p well 920 is provided for the SCSI output buffers.

D. Isolation of Power Supply Lines Utilizing SCRs

The layout of circuitry shown in FIG. 8 is unique in that, separate power supplies are provided for different sections. A first set of AVSS pins and AVDD pins are provided respectively for supplying the ground and power to the analog signal region 801. A second, separate, set of DVSS pins and DVDD pins are provided respectively for supplying the ground and power to the Ethernet digital portion 803. A third, separate, set of VSS pins and VDD pins are provided for supplying ground and power to the remainder of the digital regions 805 and 807. A fourth set of VSS3B pins and VDD3B pins are provided respectively for supplying the ground and positive potentials to output buffers of the PCI interface region. Finally, a fifth, separate, set of VSSB pins and VDDB pins are provided respectively for supplying ground and power to the output buffers of the SCSI interface region.

Figure 10:
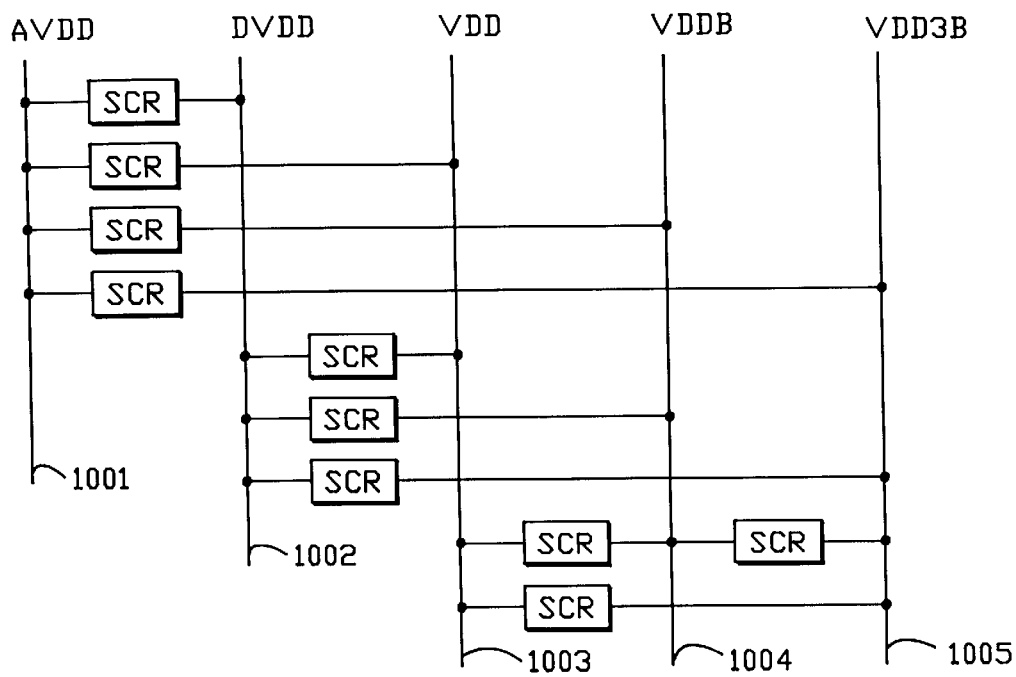
FIG. 10 illustrates the five separate power distribution networks of the present invention as separated by SCR switching devices.

Thus, there are five relatively independent power distribution networks on the integrated circuit chip 800 having power source line connections to the VDD3B, VDDB, DVDD, VDD, and AVDD pins respectively. The five power distribution networks are represented by lines 1001–1005 in FIG. 10. If power is properly supplied to all lines 1001–1005, to reduce noise coupling from the digital to the analog power supplies, the present invention utilizes switching devices, illustrated by boxes labeled SCR in FIG. 10, to isolate the respective power distribution networks 1001–1005 from one another.

By isolating the power supplies, a new potential problem arises which is explained by way of example. Suppose, power is inadvertently applied to AVDD line 1001, but not to DVDD line 1002. This could happen, for instance when the power supply of one region is switched on late. By not powering up DVDD line 1002, circuitry in Ethernet analog region 801 of chip 800 might be damaged. Such damage may result because one or more PN junctions that is supposed to be reverse biased within the chip 800 will not be so biased because an N region which was supposed to receive power from a supply has not yet turned on and will not be at the required potential. Damage to the chip 800 may result because of excessive current flow through the PN junction which is not reverse biased.

To prevent such chip damage, the present invention, isolates the regions 1001–1005 utilizing back-to-back SCRs (silicon control rectifiers), as represented by the boxes labeled SCR formed between the positive power lines represented by lines 1001–1005. The SCRs assure that all PN junctions intended to be reverse biased during chip operation are so biased. The SCRs are structured to go into a latch-up, or a conductive state, when a voltage difference develops between any two of lines 1001–1005. This is done to assure that appropriate junction-reversing bias levels are maintained throughout chip 800 even in the case where one lines 1001–1005 receives power at the same time that another does not, for example if one of power supply switches on late. No one region can be powered up without simultaneously applying some power to the other on-chip regions.

On the other hand, once power is appropriately supplied to all lines 1001–1005, the SCRs turn off, or do not latch-up. The SCRs remain off to provide isolation between the power distribution lines of the analog and digital circuit regions 1001–1005.

Figure 11:
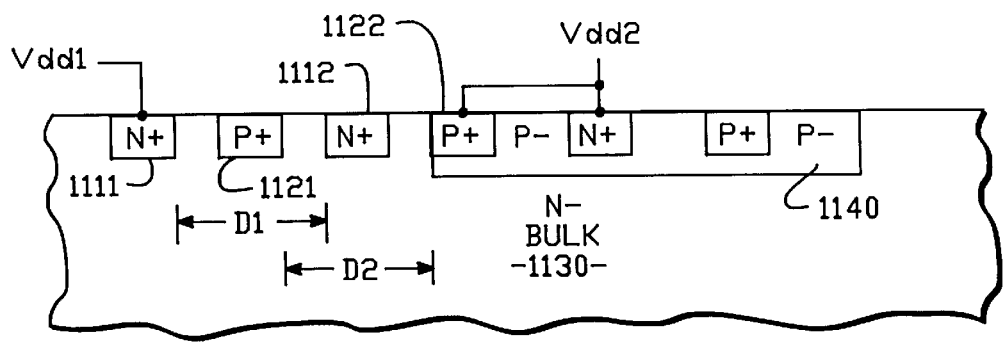
FIG. 11 illustrates a method for forming an SCRs between source power supply lines.
Figure 12:
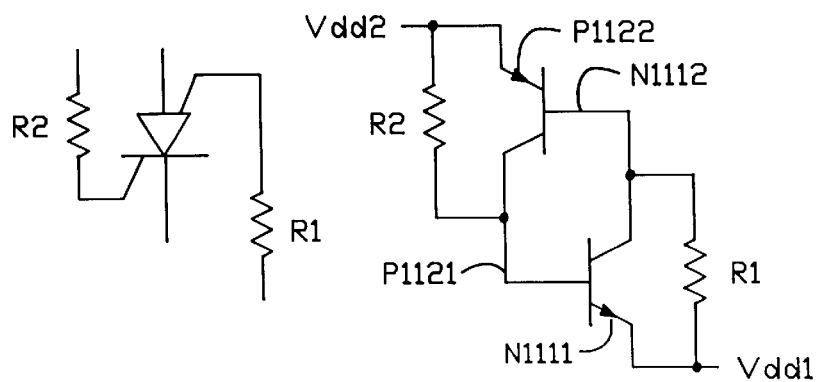
FIG. 12 shows a diagram representing how the PNPN sequence of FIG. 11 is equivalent to two transistors and further shows an equivalent circuit for the configuration of the transistors.

An area-efficient method for forming an SCR between source power supply lines is shown in FIG. 11. As is well known in the art, parasitic SCRs tend to form wherever a sequence of PNPN adjacent regions is found. The PNPN sequence is equivalent to a PNP transistor and an NPN transistor interlocked as shown in FIG. 12. catch-up is induced if enough stray current crosses the base-emitter junction of either of the PNP and NPN transistors. It is common practice to place shorting straps across base-emitter junctions of one or both of the PNP and NPN transistors where possible in order to avoid latch-up. And in places where this is not possible, the spacing D1 between the two N's of an NPN sequence and/or spacing D2 between the two P's of a PNP sequence are made sufficiently large, and the conductivities of the regions are adjusted, to minimize the risk of latch-up.

Each SCR in the sets of back-to-back SCRs of the present invention is formed by violating the traditional design rules. In FIG. 11, regions 1111, 1121 and 1112 define an NPN sequence implanted in the bulk 1130 of an N– bulk substrate. Regions 1121, 1112 and 1122 define a PNP sequence. P+ region 1122 is implanted in a P– well 1140 and strapped to positive power supply line Vdd2. N+ region 1111 is strapped to positive power supply line Vdd1. Note that P+ region 1121 is not shorted to Vdd1. Vdd1 and Vdd2 represent any two respective ones of voltages AVDD, DVDD, VDD, VDDB and VDD3B.

The spacing D1 between the two N regions, 1111 and 1112, of the NPN sequence 1111–1121–1112 and/or the spacing D2 between the two P regions, 1121 and 1122, of the PNP sequence 1121–1112–1122 are made sufficiently small, and the conductivities of the regions are appropriately adjusted, to assure that latch-up will occur when the difference between Vdd1 and Vdd2 exceeds a predefined threshold.

As seen in FIG. 12, respective distances D1 and D2 shown in FIG. 11 define equivalent, resistive paths R1 and R2 through the bulk substrate 1130. The resistance values of R1 and R2 may be adjusted by lithography and/or selection of doping concentrations to set the trigger threshold of the SCR at a desired level.

Thus, the present invention provides a plurality of switching devices such as SCRs between otherwise isolated power distribution networks of chip 800 for sensing when an excessive difference develops between the voltages of two or more otherwise isolated networks and for forming a conductive path between the networks should an excessive voltage difference occur.

Although the invention has been described above with particularity, this was merely to teach one of ordinary skill in the art how to make and use the invention. Many modifications will fall within the scope of the invention, as that scope is defined by the claims which follow. For instance, although the integrated Ethernet-SCSI controller of the present invention is disclosed as interfacing with a processor/memory system through the PCI Local Bus, other bus structures may also be utilized for an interface to the processor/memory system. Additionally, although components and the organization of components in this invention described for reduction of noise are described for application with a combined Ethernet-SCSI controller, the components can be utilized in other devices.

APPENDIX A

PIN DESCRIPTIONS

PCI INTERFACE
AD [31:00]

APPENDIX A-continued

PIN DESCRIPTIONS

Address and Data Input/Output

These signals are multiplexed on the same PCI pins. During the first clock of a transaction, AD[31:00] contains the physical byte address (32 bits). During the subsequent clocks AD[31:00] contains data. Byte ordering is little endian by default. AD[07:00] are defined as least significant byte and AD[31:24] are defined as the most significant byte. For FIFO data transfers, the Ethernet-SCSI controller can be programmed for big endian byte ordering.
During the address phase of a transaction, when the Ethernet-SCSI controller is a bus master, AD[31:2] will address the active DWORD (doubleword). The Ethernet-SCSI controller always drives AD[1:0] to '00' during the address phase indicating linear burst order. When the Ethernet-SCSI controller is not a bus master, the AD[31:00] lines are continuously monitored to determine if an address match exists for I/O slave transfers. During the data phase of a transaction, AD[31:00] are driven by the Ethernet-SCSI controller when performing bus master writes and slave read operations. Data on AD[31:00] is latched by the Ethernet-SCSI controller when performing bus master reads and slave write operations.
When RST is active, AD[31:0] are inputs for NAND tree testing.
C/BE[3:0]
Bus Command and Byte Enables These signals are multiplexed on the same PCI pins. During the address phase of a transaction, C/BE[3:0] define the bus command. During the data phase C/BE[3:0] are used as Byte Enables. The Byte Enables define which physical byte lanes carry meaningful data. C/BE0 applies to byte 0 (AD[7:00]) and C/BE3 applies to byte 3 (AD[31:24]). The function of the Byte Enables is independent of the byte ordering mode (CSR3, bit 2).
When RST is active, C/BE[3:0] are inputs for NAND tree testing.
CLK
Clock This signal provides timing for all the transactions on the PCI bus and all PCI devices on the bus including the Ethernet-SCSI controller. All bus signals are sampled on the rising edge of CLK and all parameters are defined with respect to this edge. The Ethernet-SCSI controller operates over a range of 0 to 33 MHz.
When RST is active, CLK is an input for NAND tree testing.
DEVSEL
Device Select This signal when actively driven by the Ethernet-SCSI controller as a slave device signals to the master device that the Ethernet-SCSI controller has decoded its address as the target of the current access. As an input it indicates whether any device on the bus has been selected.

APPENDIX A-continued

PIN DESCRIPTIONS

When RST is active, DEVSEL is an input for NAND tree testing.
FRAME
Cycle Frame

This signal is driven by the Ethernet-SCSI controller when it is the bus master to indicate the beginning and duration of the access. FRAME is asserted to indicate a bus transaction is beginning. FRAME is asserted while data transfers continue. FRAME is deasserted when the transaction is in the final data phase.
When RST is active, FRAME is an input for NAND tree testing.
GNTA
Bus Grant This signal indicates that the access to the PCI bus has been granted to the Ethernet-SCSI controller.
When RST is active, GNTA or GNTB is an input for NAND tree testing.
GNTB
Bus Grant This signal indicates that the access to the PCI bus has been granted to the Ethernet-SCSI controller.
When RST is active, GNTA or GNTB is an input for NAND tree testing.
IDSELA
Initialization Device Select This signal is used as a chip select for the Ethernet-SCSI controller in lieu of the 24 address lines during configuration read and write transaction.
When RST is active, IDSELA is an input for NAND tree testing.
IDSELB
Initialization Device Select This signal is used as a chip select for the Ethernet-SCSI controller during configuration read and write transaction.
When RST is active, IDSELB is an input for NAND tree testing.
INTA
Interrupt Request This signal combines the interrupt requests from both the DMA engine and the SCSI core. The interrupt source can be determined by reading the DMA Status Register. It is cleared when the Status Register is read.
When RST is active, INTA is an input for NAND tree testing. This is the only time INTA is an input.
INTB
Interrupt Request An asynchronous attention signal which indicates that one or more of the following status flags is set: BABL, MISS, MERR, RINT, IDON, RCVCCO, RPCO, JAB, MPCO, or TXSTRT. Each status flag has a mask bit which allows for suppression of INTB assertion.
When RST is active, INTB is an input for NAND tree testing. This is the only time INTB is an input.

APPENDIX A-continued

PIN DESCRIPTIONS

IRDY
Initiator Ready

This signal indicates the Ethernet-SCSI controller's ability, as a master device, to complete the current data phase of the transaction. IRDY is used in conjunction with the TRDY. A data phase is completed on any clock when both IRDY and TRDY are asserted. During a write, IRDY indicates that valid data is present on AD[31:00]. During a read, IRDY indicates that data is accepted by the Ethernet-SCSI controller as a bus master. Wait states are inserted until both IRDY and TRDY are asserted simultaneously.
When RST is active, IRDY is an input for NAND tree testing.

LOCK
Lock

LOCK is used by the current bus master to indicate an atomic operation that may require multiple transfers.
As a slave device, the Ethernet-SCSI controller can be locked by any master device. When another master attempts to access the Ethernet-SCSI while it is locked, the Ethernet-SCSI controller will respond by asserting DEVSEL and STOP with TRDY deasserted (PCI retry).
The Ethernet-SCSI controller will never assert LOCK as a master.
When RST is active, LOCK is an input for NAND tree testing.

PAR
Parity

Parity is even parity across AD[31:00] and C/BE[3:0]. When the Ethernet-SCSI controller is a bus master, it generates parity during the address and write data phases. It checks parity during read data phases. When the Ethernet-SCSI controller operates in slave mode and is the target of the current cycle, it generates parity during read data phases. It checks parity during address and write data phases.
When RST is active, PAR is an input for NAND tree testing.

PERR
Parity Error

The signal is asserted for one CLK by the Ethernet-SCSI controller when it checks for parity detect an error during any data phase when its AP[31:00] lines are inputs. The PERR pin is only active when PERREN (bit 6) in the PCI command register is set.
The Ethernet-SCSI controller monitors the PERR input during a bus master write cycle. It will assert the Data Parity Reported bit in the Status register of the Configuration Space when a parity error is reported by the target device.
When RST is active, PERR is an input for NAND tree testing.

REQA
Reset

The Ethernet-SCSI controller asserts REQA pin as a signal that it wishes to become a bus master. Once asserted, REQA remains active until GNTA or GNTB has become active.

APPENDIX A-continued

PIN DESCRIPTIONS

When RST is active, REQA is an input for NAND tree testing. This is the only time REQA is an input.

REQB
Bus Request

The Ethernet-SCSI controller asserts REQB pin as a signal that it wishes to become a bus master. Once asserted, REQB remains active until GNTA or of SLEEP or setting of the STOP bit or access to the S_RESET port (off-set 14h).
When RST is active, REQB is an input for NAND tree testing. This is the only time REQB is an input.

RST
Reset

When RST is asserted low, then the Ethernet-SCSI controller performs an internal system reset of the type H_RESET (HARDWARE_RESET). RST must be held for a minimum of 30 CLK periods. While in the H_RESET state, the Ethernet-SCSI controller will disable or deassert all outputs. RST may be asynchronous to the CLK when asserted or deasserted. It is recommended that the deassertion be synchronous to the guarantee clean and bounce free edge.
When RST is active, NAND tree testing is enabled. All PCI interface pins are in input mode. The result of the NAND tree testing can be observed on the BUSY output (pin 62).

SERR
System Error

This signal is asserted for one CLK by the Ethernet-SCSI controller when it detects a parity error during the address phase when its AD[31:00] lines are inputs.
The SERR pin is only active when SERREN (bit 8) and PERREN (bit 6) in the PCI command register are set.
When RST is active, SERR is an input for NAND tree testing.

STOP
Stop

In the slave role, the Ethernet-SCSI controller drives the STOP signal to inform the bus master to stop the current transaction. In the bus master role, the Ethernet-SCSI controller receives the STOP signal and stops the current transaction.
When RST is active, STOP is an input for NAND tree testing.

TRDY
Target Ready

This signal indicates that the Ethernet-SCSI controllers ability as a selected device to complete the current data phase of the transaction. TRDY is used in conjunction with the IRDY. A data phase is completed on any clock both TRDY and IRDY are asserted. During a read TRDY indicates that valid data is present on AD[31:00]. During a write, TRDY indicates that data has been accepted. Wait states are inserted until both IRDY and TRDY are asserted simultaneously.

APPENDIX A-continued

PIN DESCRIPTIONS

When RST is active, TRDY is an input for NAND tree testing.
ETHERNET INTERFACE
LNK
LINK Status This pin provides 12 mA for driving an LED. By default, it indicates an active link connection on the 10BASE-T interface. This pin can also be programmed to indicate other network status. The LNKST pin polarity is programmable, but by default, it is active LOW. Note that this pin is multiplexed with the EEDI function.
LEDP
LED Predriver This pin is shared with the EEDO function. When functioning as LED3 the signal on this pin is programmable through BCR7. By default, LED3 is active LOW and it indicates transmit activity on the network. Special attention must be given to the external circuitry attached to this pin. If an LED circuit were directly attached to this pin, it would create an IOL requirement that could not be met by the serial EEPROM that would also be attached to this pin. (This pin is multifunctioned with EEDO function of the Microwire serial EEPROM interface.) Therefore, if this pin is to be used as an additional LED output while an EEPROM is used in the system, then buffering is required between the LED3 pin and the LED circuit. If no EEPROM is included in the system design, then the LED3 signal may be directly connected to an LED without buffering. The LED3 output from the Ethernet-SCSI controller is capable of sinking the necessary 12 mA of current to drive an LED in this case.
LED1
LED1

This pin is shared with the EESK function. As LED1, the function and polarity of this pin are programmable through BCR5. By default, LED1 is active LOW and it indicates receive activity on the network. The LED1 output from the Ethernet-SCSI controller is capable of sinking the necessary 12 mA of current to drive an LED directly.
The LED1 pin is also used during EEPROM Auto-detection to determine whether or not an EEPROM is present at the Ethernet-SCSI controller Microwire interface. At the trailing edge of the RST pin, LED1 is sampled to determine the value of the EEDET bit in BCR19. A sampled HIGH value means that an EEPROM is present, and EEDET will be set to ONE. A sampled LOW value means that an EEPROM is not present, and EEDET Will be set to ZERO.
If no LED circuit is to be attached to this pin, then a pull up or pull down resistor must be attached instead, in order to resolve the EEDET setting.
SLEEP
Sleep When SLEEP is asserted (active LOW), the Ethernet-SCSI controller performs an internal system reset of the S_RESET type and then proceeds into a power savings mode. (The reset operation caused by SLEEP assertion will not affect BCR registers.) The PCI interface section is not effected by SLEEP. In particular, access to the PCI configuration space remains possible. None of the configuration registers will be reset by SLEEP. All I/O accesses to the Ethernet-SCSI controller will result in a PCI target abort response. The Ethernet-SCSI controller will not assert REQ while in sleep mode. When SLEEP is asserted, all non-PCI interface outputs will be placed in their normal S_RESET condition. All non-PCI interface inputs will be ignored except for the SLEEP pin itself. De-assertion of SLEEP results in wake-up. The system must refrain from starting the network operations of the Ethernet-SCSI device for 0.5 seconds following the deassertion of the SLEEP signal in order to allow internal analog circuits to stabilize.
Both CLK and XTAL1 inputs must have valid clock signals present in order for the SLEEP command to take effect. If SLEEP is asserted while REQ is asserted, then the Ethernet-SCSI controller will wait for the assertion of GNTA or GNTB. When GNTA or GNTB is asserted, the REQ signal will be deasserted and then the Ethernet-SCSI controller will proceed to the power savings mode.
The SLEEP pin should not be asserted during power supply ramp-up. If it is desired that SLEEP be asserted at power up time, then the system must delay the assertion of SLEEP until three CLK cycles after the completion of a valid pin RST operation.
XTAL1, XTAL2
XTAL1-Crystal Oscillator Input
XTAL2-Crystal Oscillator Output The crystal frequency determines the network data rate. The Ethernet-SCSI controller supports the use of quartz crystals to generate a 20 MHz frequency compatible with the ISO 8802-3 (IEEE/ANSI 802.3) network frequency tolerance and jitter specifications.
The network data rate is one-half of the crystal frequency. XTAL1 may alternatively be driven using an external CMOS level source, in which case XTAL2 must be left unconnected. Note that when the Ethernet-SCSI controller is in comma mode, there is an internal 22 KΩ resistor from XTAL1 to ground. If an external source drives XTAL1, some power will be consumed driving this resistor. If XTAL1 is driven LOW at this time power consumption will be minimized. In this case, XTAL1 must remain active for at least 30 cycles after the assertion of SLEEP and deassertion of REQ.
MICROWIRE EEPROM INTERFACE
EECS
EEPROM Chip Select The function of the EECS signal is to indicate to the Microwire EEPROM device that it is being accessed. The EECS signal is active high. It is controlled by either the Ethernet-SCSI

APPENDIX A-continued

PIN DESCRIPTIONS controller during command portions of a read of the entire EEPROM, or indirectly by the host system by writing to BCR19 bit 2.

EEDI
EEPROM Data In

The EEDI signal is used to access the external ISO 8802-3 (IEEE/ANSI 802.3) address PROM. EEDI functions as an output. This pin is designed to directly interface to a serial EEPROM that uses the Microwire interface protocol. EEDI is connected to the Microwire EEPROMs Data Input pin. It is controlled by either the Ethernet-SCSI controller during command portions of a read of the entire EEPROM, or indirectly by the host system by writing to BCR19 bit 0.
EEDI is shared with the LNKST function.

EEDO
EEPROM Data Out

The EEDO signal is used to access the external ISO 8802-3 (IEEE/ANSI 802.3) address PROM. This pin is designed to directly interface to a serial EEPROM that uses the Microwire interface protocol. EEDO is connected to the Microwire EEPROMs Data Output pin. It is controlled by the EEPROM during reads. It may be read by the host system by reading BCR19 bit 0.

EESK
EEPROM Serial Clock

The EESK signal is used to access the external ISO 8802-3 (IEEE/ANSI 802.3) address PROM. This pin is designed to directly interface to a serial EEPROM that uses the Microwire interface protocol. EESK is connected to the Microwire EEPROMs Clock pin. It is controlled by either the Ethernet-SCSI controller directly during a read of the entire EEPROM, or indirectly by the host system by writing to BCR19, bit 1.
The EESK pin is also used during EEPROM Auto-detection to determine whether or not an EEPROM is present at the Ethernet-SCSI controller Microwire interface. At the trailing edge of the RST signal, LED1 is sampled to determine the value of the EEDET bit in BCR19. A sampled HIGH value means that an EEPROM is present, and EEDET will be set to ONE. A sampled LOW value means that an EEPROM is not present, and EEDET will be set to ZERO.
EESK is shared with the LED1 function. If no LED circuit is to be attached to this pin, then a pull up or a pull down resistor must be attached instead, in order to resolve the EEDET setting.

ATTACHMENT UNIT INTERFACE
CI±
Collision In

A differential input pair signaling the Ethernet-SCSI controller that a collision has been detected on the network media, indicated by the CI± inputs being driven with a 10 MHz pattern of sufficient amplitude and pulse width to meet ISO 8802-3 (IEEE/ANSI 802.3) standards. Operates at pseudo ECL levels.

DI±
Data In

A differential input pair to the Ethernet-SCSI controller carrying Manchester encoded data from the network. Operates at pseudo ECL levels.

DO±
Data Out

A differential output pair from the Ethernet-SCSI controller for transmitting Manchester encoded data to the network. Operates at pseudo ECL levels.

TWISTED PAIR INTERFACE
RXD±
10BASE-T Receive Data

10BASE-T port differential receivers.

TXD±
10BASE-T Transmit Data

10BASE-T port differential drivers.

TXP±
10BASE-T Pre distortion Control

These outputs provide transmit pre-distortion control in conjunction with the 10BASE-T port differential drivers.

SCSI INTERFACE
SD[7:0]
SCSI Data

These pins are defined as bi-directional SCSI data bus.

SDIOP
SCSI Data Parity

This pin is defined as bi-directional data parity.

MSG
Message

This pin is a Schmitt trigger input in the initiator mode.

C/D
Command/Data

This pin is a Schmitt trigger input in the initiator mode.

I/O
Input/Output

This pin is a Schmitt trigger input in the initiator mode.

ATN
Attention

This signal is a 48 mA output in the initiator mode. This signal will be asserted when the device detects a parity error; also, it can be asserted via certain commands.

BSY
Busy

As a SCSI input signal it has a Schmitt trigger and as an output signal it has a 48 mA drive.

SEL
Select

As a SCSI input signal it has a Schmitt trigger and as an output signal it has a 48 mA drive.

APPENDIX A-continued

PIN DESCRIPTIONS

RST
Reset

As a SCSI input signal it has a Schmitt trigger and as an output signal it has a 48 mA drive.
REQ
Request This is a SCSI input signal with a Schmitt trigger in the initiator mode.
ACK
Acknowledge This is a SCSI output signal with a 48 mA drive in the initiator mode.
MISCELLANEOUS
SCSI CLK
SCSI Clock The SCSI clock signal is used to generate all internal device timings. The maximum frequency of this input is 40 MHz and a minimum of 10 MHz is required to maintain the SCSI bus timings.
RESERVE
Reserved_DO NOT CONNECT This pin (#116) is reserved for internal test logic. It MUST NOT BE CONNECTED to anything for proper chip operation.
BUSY
NAND Tree Out This signal is logically equivalent to the SCSI bus signal BSY. It is duplicated so that external logic can be connected to monitor SCSI bus activity.
The results of the NAND tree testing can be observed on the BUSY pin where RST is asserted, otherwise, BUSY will reflect the state of the SCSI Bus Signal line BSY (pin 64).
PWDN
Power Down Indicator This signal, when asserted, sets the PWDN status bit in the DMA status register and sends an interrupt to the host.
POWER SUPPLY PINS
ANALOG POWER SUPPLY
PINS
$AV_{DD}$
Analog Power There are four power supply pins used to supply power to the analog portion of the Ethernet circuitry.
$AV_{SS}$
Analog Ground There are two ground pins used by the analog portion of the Ethernet circuitry.
DIGITAL POWER SUPPLY
PINS
$DV_{DD}$
Ethernet Digital Power There are 2 ground pins for digital portion of Ethernet circuitry.
$DV_{SS}$
Ethernet Digital Ground There are 2 power supply pins for digital portion of Ethernet circuitry
$V_{DD}$

APPENDIX A-continued

PIN DESCRIPTIONS

Digital Power

There are 6 power supply pins that are used by the SCSI, PCI digital circuitry and I/O buffers not supported by the $V_{DDB}$ and $V_{DD3B}$ pins.
$V_{SS}$
Digital Ground There are 12 ground pins that are used by the internal digital circuitry. Pin 119 provides ground for the CLK pin I/O buffer. Pins 11 provide ground for PCI DMA logic. Pin 62 provides ground for SCSI internal logic. Pin 60 provides ground for additional input buffers.
$V_{DDB}$
SCSI I/O Buffer Power There are 4 power supply pins that are used by the SCSI bus Input/Output buffer drivers.
$V_{SSB}$
SCSI I/O Buffer Ground There are 8 ground pins that are used by the SCSI Input/Output buffers connected to the following pins: SDIO[7:0], SDIOP, BSY, ATN, RST, SEL, REQ, AOL, MSG, AD and IO.
$V_{DD3B}$
PCI I/O Buffer Ground There are 4 power supply pins that are used by the PCI Input/Output buffers connected to the AD[31:0], PAR and C/BE[3:0] pins.
$V_{SS3B}$
PCI I/O Buffer Ground There are 8 ground pins that are needed by the PCI Input/Output buffers connected to the AD[31:0], PAR and C/BE[3:0] pins.

What is claimed is:

1. An apparatus comprising a SCSI controller and an Ethernet controller integrated onto a single integrated circuit chip, wherein the SCSI and Ethernet controller include digital control circuitry coupled to buffers, and the Ethernet controller includes analog circuitry, wherein circuitry on the integrated circuit chip is configured to limit noise generated in the analog circuitry by signals in the digital control circuitry, wherein the circuitry on the integrated circuit chip comprises $V_{SS}$ leads including a first set of $V_{SS}$ leads connected to the digital control circuitry and the analog circuitry and a second set of $V_{SS}$ leads connected only to the buffers.

2. The apparatus of claim 1 wherein the buffers comprise first and second buffers, wherein the first buffers are each connected to one of the second set of $V_{SS}$ leads by a line separate from the second buffers.

3. An apparatus comprising a SCSI controller and an Ethernet controller integrated onto a single integrated circuit chip, wherein the SCSI and Ethernet controller include digital control circuitry coupled to buffers, and the Ethernet controller includes analog circuitry, wherein the circuitry on the integrated circuit chip is configured to limit noise generated in the analog circuitry by signals in the digital control circuitry, wherein the integrated circuit chip includes a data input for receiving a data signal and an output, wherein each of the buffers comprise:

transistor pairs, each transistor pair having a pull up transistor and a pull down transistor, wherein each of the pull up transistors has a source to drain path connected between $V_{DD}$ and the buffer output, and wherein each of the pull down transistors has a source to drain path connected between $V_{SS}$ and the buffer output; and delay elements connected in series, wherein a first one of the delay elements has an input forming the data input of the buffer, and wherein each of the delay elements has an output coupled to a gate of each of the pull up and pull down transistors of one of the transistor pairs.

4. An apparatus comprising a SCSI controller and an Ethernet controller integrated onto a single integrated circuit chip, wherein the SCSI and Ethernet controller include digital control circuitry coupled to buffers, and the Ethernet controller includes analog circuitry, wherein circuitry on the integrated circuit chip is configured to limit noise generated in the analog circuitry by signals in the digital control circuitry, wherein the analog circuitry is located separate from the digital control circuitry and the buffers.

5. An apparatus comprising a SCSI controller and an Ethernet controller integrated onto a single integrated circuit chip, wherein the SCSI and Ethernet controller include digital control circuitry coupled to buffers, and the Ethernet controller includes analog circuitry, wherein circuitry on the integrated circuit chip is configured to limit noise generated in the analog circuitry by signals in the digital control circuitry, wherein current density in the digital control circuitry increases in a direction away from the analog circuitry.

6. An apparatus comprising a SCSI controller and an Ethernet controller integrated onto a single integrated circuit chip, wherein the SCSI and Ethernet controller include digital control circuitry coupled to buffers, and the Ethernet controller includes analog circuitry, wherein circuitry on the integrated circuit chip is configured to limit noise generated in the analog circuitry by signals in the digital control circuitry, wherein the circuitry on the integrated circuit chip comprises:

power distribution networks, including a first network connected to distribute power to the analog circuitry, a second network connected to distribute power to the digital control circuitry and a third network connected to distribute power to the buffers; and silicon control rectifiers (SCRs) connected between the power distribution networks, each SCR for sensing when a voltage difference between two of the power distribution networks exceeds a predefined limit, and for forming a conductive path between the two networks when the predefined limit is reached.

7. An integrated circuit comprising:

internal circuitry;

buffers; and $V_{SS}$ leads including a first set of $V_{SS}$ leads connected to the internal circuitry and a second set of $V_{SS}$ leads connected only to the buffers.

8. The integrated circuit of claim 7 wherein the buffers comprise first and second buffers, wherein the first buffers are each connected to one of the second set of $V_{SS}$ leads by a line separate from the second buffers.

9. The integrated circuit of claim 7 wherein the first set of $V_{SS}$ leads comprises analog $V_{SS}$ leads and digital $V_{SS}$ leads and wherein the internal circuitry comprises:

digital control circuitry connected to the digital $V_{SS}$ leads; and analog circuitry connected to the analog $V_{SS}$ leads.

* * * * *